United States Patent
Schwab et al.

(10) Patent No.: US 6,610,213 B1
(45) Date of Patent: Aug. 26, 2003

(54) PROCESS FOR THE WET CHEMICAL TREATMENT OF A SEMICONDUCTOR WAFER

(75) Inventors: Günter Schwab, Emmerting (DE); Maximilian Stadler, Haiming (DE)

(73) Assignee: Wacker Siltronic Gesellschaft für Halbleitermaterialien, Burghausen (DE)

( * ) Notice: Subject to any disclaimer, the term of this patent is extended or adjusted under 35 U.S.C. 154(b) by 0 days.

(21) Appl. No.: 09/575,011

(22) Filed: May 19, 2000

(30) Foreign Application Priority Data

Jun. 16, 1999 (DE) .......................... 199 27 527

(51) Int. Cl.[7] .............................................. B44C 1/22
(52) U.S. Cl. ........................ 216/83; 216/93; 134/1.3; 438/745
(58) Field of Search ............. 216/83, 93; 134/102.1, 134/102.2, 1.3; 156/345.18; 438/745

(56) References Cited

U.S. PATENT DOCUMENTS

| | | | | |
|---|---|---|---|---|
| 3,964,957 A | * | 6/1976 | Walsh | 118/500 |
| 5,227,010 A | * | 7/1993 | Lubert et al. | 156/642 |
| 5,327,921 A | * | 7/1994 | Mokuo et al. | 134/182 |
| 5,340,437 A | | 8/1994 | Erk et al. | 156/639 |
| 5,451,267 A | * | 9/1995 | Stadler et al. | 134/30 |
| 5,674,410 A | | 10/1997 | Nakajima et al. | 216/92 |
| 5,954,888 A | * | 9/1999 | Gupta et al. | 134/3 |
| 6,017,827 A | * | 1/2000 | Morgan et al. | 438/745 |
| 6,200,414 B1 | * | 3/2001 | Hwang et al. | 156/345.18 |
| 6,220,259 B1 | * | 4/2001 | Brown et al. | 134/184 |

FOREIGN PATENT DOCUMENTS

| | | | | |
|---|---|---|---|---|
| EP | 0 625 795 B1 | 9/1996 | | |
| JP | 02-70076 A | * 3/1990 | | 216/90 |
| JP | 05-345173 A | * 12/1993 | | 134/31 |

* cited by examiner

*Primary Examiner*—Anita Alanko
(74) *Attorney, Agent, or Firm*—Collard & Roe, P.C.

(57) ABSTRACT

A process for the wet chemical treatment of a semiconductor wafer in a vessel, in which the semiconductor wafer is brought into contact with a liquid in which very small gas bubbles are dispersed. Two circuits are set up for conveying the liquid, with a first circuit between a reservoir and the vessel, for conveying the liquid from the reservoir to the vessel; and with a second circuit from the reservoir back to the reservoir, in order to enrich the liquid with a gas on the way back to the reservoir, so that the gas bubbles can form.

13 Claims, 2 Drawing Sheets

PROCESS FOR THE WET CHEMICAL TREATMENT OF A SEMICONDUCTOR WAFER

BACKGROUND OF THE INVENTION

1. Field of the Invention

The present invention relates to a process for the wet chemical treatment of a semiconductor wafer in a vessel, in which the semiconductor wafer is brought into contact with a liquid in which very small gas bubbles are dispersed.

2. The Prior Art

During the wet chemical treatment of semiconductor wafers with a liquid, it is generally necessary to ensure that the liquid acts uniformly on the surface of the semiconductor wafer. This requirement is important in particular for the wet chemical etching of a semiconductor wafer. Since semiconductor wafers are advantageously etched not individually, but rather in batches, it is difficult to achieve uniform action of the etchant everywhere on the surface of the semiconductor wafer. Uneven etching immediately becomes apparent on comparing measured values which describe the planarity of the semiconductor wafer and are determined before and after etching.

EP-625 795 B1 discloses having a liquid in which extremely fine gas bubbles are dispersed to flow onto semiconductor wafers. For this purpose, the liquid is intensively mixed with a gas before it enters a treatment chamber. It has been found that with this process it is almost impossible to keep the concentration of the gas bubbles constant over a prolonged period. Moreover, with this process it is only possible to maintain for an insufficient extent, the desired laminar flow of liquid in the treatment chamber.

SUMMARY OF THE INVENTION

It is therefore an object of the present invention to create a remedy to these problems and to provide a more advantageous process.

The present invention achieves this object and relates to a process for the wet chemical treatment of a semiconductor wafer in a vessel, in which the semiconductor wafer is brought into contact with a liquid in which very small gas bubbles are dispersed. Two circuits are set up for conveying the liquid, with one circuit between a reservoir and the vessel, for conveying the liquid from the reservoir to the vessel and back to the reservoir. Another circuit is from the reservoir back to the reservoir, in order to mix the liquid with a gas on the way back to the reservoir, so that the gas bubbles can form.

The process of the invention has the advantage that the wet chemical treatment of a semiconductor wafer occurs more evenly over the entire wafer surfaces. The outlay involved in making existing treatment apparatus suitable for the process is low.

It is preferable for the gas bubbles to be produced, in the manner described in the abovementioned patent, with the aid of a feed pump. The feed pump draws in the liquid and the gas and then disperses the gas into the liquid in the form of extremely small gas bubbles. Preferred feed pumps are centrifugal pumps or axial-flow pumps, which result in intensively mixing of the gas and the liquid.

However, the gas bubbles may also be produced by dissolving the gas into the liquid under increased gas pressure and then by reducing the pressure of the pressurized liquid or with the aid of a static mixer or mixers.

BRIEF DESCRIPTION OF THE DRAWING

Other objects and features of the present invention will become apparent from the following detailed description considered in connection with the accompanying drawing which discloses an embodiment of the present invention. It should be understood, however, that the drawing is designed for the purpose of illustration only and not as a definition of the limits of the invention.

The invention is explained in more detail below with reference to a figure, which diagrammatically depicts the structure of an apparatus which is suitable for carrying out the process of the invention.

DETAILED DESCRIPTION OF PREFERRED EMBODIMENTS

Turning now in detail to the drawings, the medium which is provided for the treatment of the semiconductor wafer is situated in a reservoir tank 1. It comprises a liquid in which very small gas bubbles are homogeneously dispersed. Water or known aqueous solutions for cleaning semiconductor wafers or aqueous etching solutions, in particular those which contain hydrogen fluoride, are the liquids which are preferably used. Furthermore, it is advantageous for a surfactant to be added to the liquid used, preferably in a concentration of from 0.05% to 1% by volume. The concentration of gas bubbles remains approximately constant, since a flow of treatment medium out of the reservoir tank is balanced by a flow of liquid with a low gas bubble content flowing into the tank and a flow of liquid with a high gas bubble content into the reservoir tank.

Figure 1:
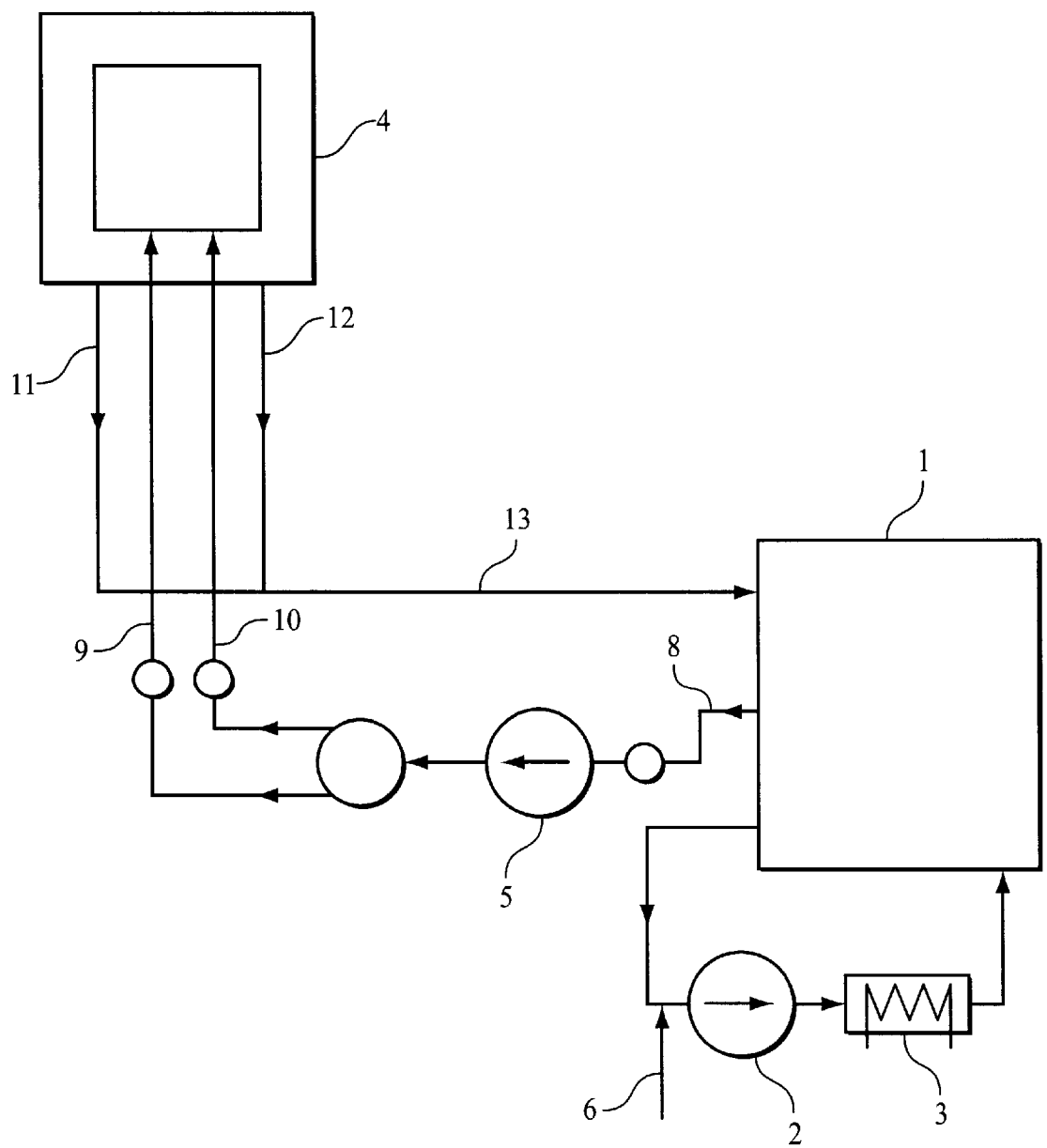
FIG. 1 shows a first embodiment of the present invention.

According to the invention, a circuit is provided in which the liquid circulates from the reservoir tank 1 back into this reservoir tank. On the way back into the reservoir tank, the liquid is enriched with the gas. In accordance with the first embodiment of the invention illustrated in FIG. 1 in the drawing, this takes place with the aid of a feed pump 2, which, on the intake side, is fed with the gas 6, preferably nitrogen, as well as with the liquid. Of course, other gases can also be used, such as for example inert gases, air, oxygen or other mixtures of the abovementioned gases.

The liquid which emerges from the feed pump and has been enriched with small gas bubbles passes back into the reservoir tank 1 via a heat exchanger 3. A second circuit is set up between the reservoir tank and a vessel 4, in which the wet chemical treatment of one or more semiconductor wafers takes place, for example in a basin. The treatment medium is conveyed out of the reservoir tank, driven by-a second pump 5, into the vessel and, as a laminar flow of liquid mixed with extremely small gas bubbles, passes to the semiconductor wafer, which is preferably rotating slowly.

The first circuit between reservoir tank 1 back to reservoir tank 1 and the second circuit between reservoir tank 1 and vessel 4 are such that the two circuits are separate at all points and do not overlap with each other. However, the first circuit and the second circuit both include only the reservoir and overlap only in that sense.

Particularly when a plurality of semiconductor wafers are being treated simultaneously, it is advantageous for the incoming flow in single line 8 of treatment medium to be divided into at least two partial streams 9 and 10 into vessel 4. The return part of this circuit is two substreams 11 and 12 which returns liquid which has a low gas bubble content joined as a recombined stream 13 to the reservoir tank 1.

Figure 2:
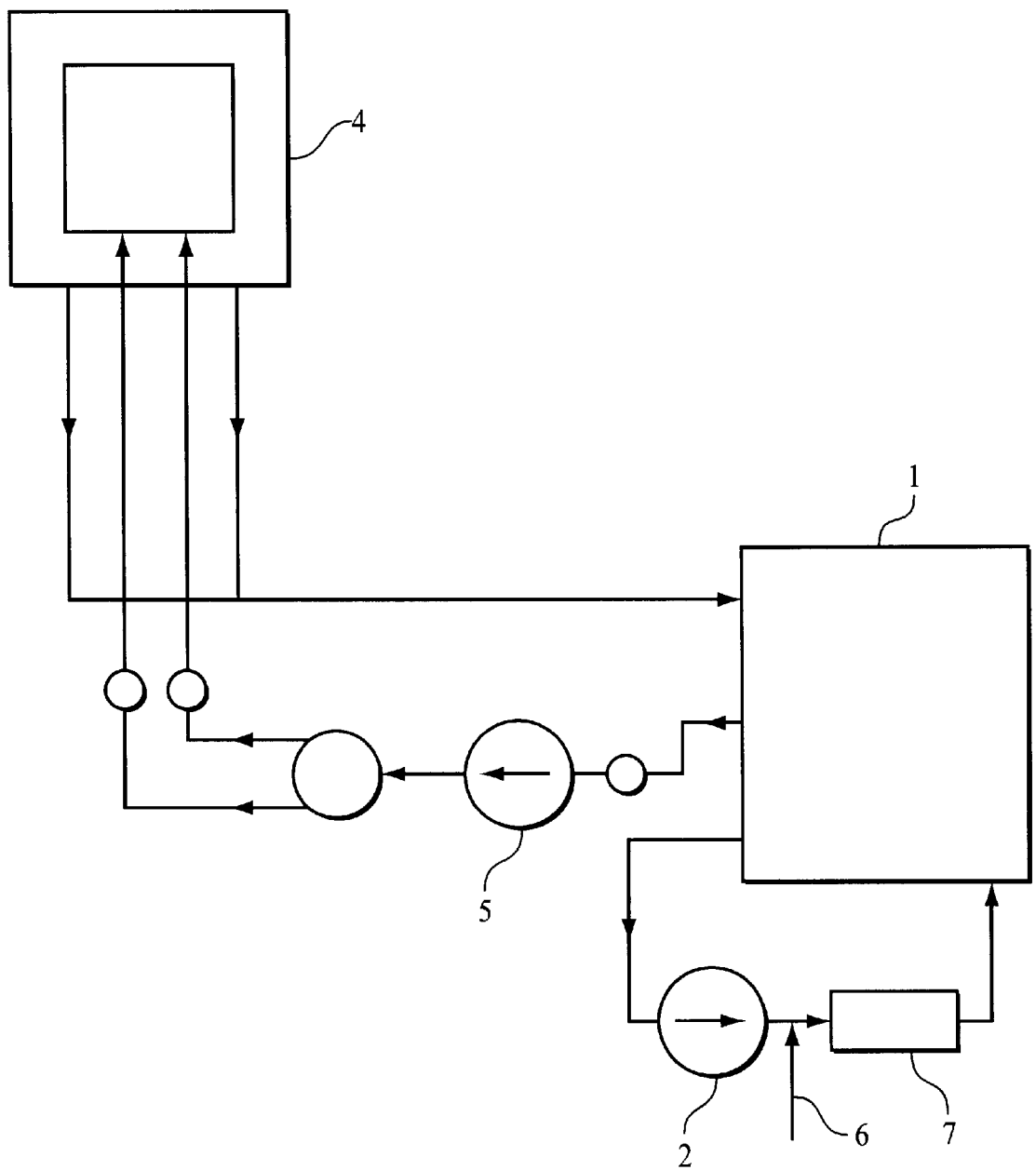
FIG. 2 shows a second embodiment of the present invention.

In accordance with a second embodiment of the invention illustrated in FIG. 2, the bubbles are produced with the aid of a static mixer 7.

The advantage of the process of the invention is clear from the following Example which is compared with a Comparative Example.

EXAMPLE 1 (INVENTION)

25 semiconductor wafers made from silicon were etched in a vessel containing an aqueous, acidic etchant in the manner according to the invention. The planarity of the semiconductor wafers (GBIR value=global planarity measure) was checked before and after the wet chemical treatment. The measured values are set forth in the following Table, indicating a deviation from an optimum etching result and therefore reflecting the extent to which the shape of the wafers was maintained during etching.

COMPARATIVE EXAMPLE

An identical number of semiconductor wafers of the same type was etched under identical conditions, but with the process described in EP-625 795 B1 being used.

TABLE

Geometry change
Material removed by etching: 30 μm
Measuring equipment: ADE 9700

| Wafer number | Comparative example: (Delta GBIR) | Example: (Delta GBIR) |
| --- | --- | --- |
| 1 | 0.5 | 0.2 |
| 2 | 0.7 | 0.4 |
| 3 | 0.2 | 0.2 |
| 4 | 0.5 | 0.4 |
| 5 | 0.4 | 0.3 |
| 6 | 0.6 | 0.5 |
| 7 | 0.9 | 0.3 |
| 8 | 0.2 | 0.3 |
| 9 | 0.5 | 0.2 |
| 10 | 0.9 | 0.2 |
| 11 | 1.0 | 0.2 |
| 12 | 0.4 | 0.0 |
| 13 | 0.6 | 0.2 |
| 14 | 0.6 | 0.5 |
| 15 | 0.7 | 0.3 |
| 16 | 0.7 | 0.2 |
| 17 | 0.4 | 0.2 |
| 18 | 0.9 | 0.2 |
| 19 | 0.2 | 0.2 |
| 20 | 0.3 | 0.3 |
| 21 | 0.5 | 0.4 |
| 22 | 0.6 | 0.3 |
| 23 | 0.3 | 0.2 |
| 24 | 0.4 | 0.3 |
| 25 | 0.5 | 0.2 |

It can be seen from the Table that, using the process according to the invention, it was possible to achieve a significantly more uniform removal of material by etching, since the planarity of the semiconductor wafers was changed to a lesser extent.

Accordingly, while a few embodiments of the present invention have been shown and described, it is to be understood that many changes and modifications may be made thereunto without departing from the spirit and scope of the invention as defined in the appended claims.

What is claimed is:

1. A process for the wet chemical treatment of a semiconductor wafer in a vessel, comprising the steps of
   dispersing gas bubbles in a liquid;
   bringing the semiconductor wafer into contact with said liquid in which gas bubbles are dispersed in said vessel to obtain uniform removal of material by etching;
   providing two circuits for conveying the liquid,
   with a first circuit from a reservoir back to the reservoir, in order to enrich the liquid with a gas on the way back to the reservoir, so that the gas bubbles are formed; and
   with a second circuit between the reservoir and the vessel for conveying the liquid from the reservoir to the vessel and back to the reservoir; and
   said first circuit and said second circuit being separate at all points and not overlapping with each other.

2. The process as claimed in claim 1, comprising
   intensively mixing the gas and the liquid in a feed pump, so that the gas bubbles are formed; and
   passing the liquid containing the gas bubbles into the reservoir.

3. The process as claimed in claim 1, comprising
   dissolving the gas in the liquid under increased gas pressure;
   passing the liquid containing the dissolved gas into the reservoir; and reducing the pressure of the gas in the reservoir so that the gas bubbles are formed in the liquid.

4. The process as claimed in claim 1, comprising
   mixing the gas and the liquid using a static mixer, so that the gas bubbles are formed in the liquid; and
   passing the liquid containing the gas bubbles into the reservoir.

5. A process for the wet chemical treatment of a semiconductor wafer in a vessel, comprising the steps of
   dispersing gas bubbles in a liquid;
   bringing the semiconductor wafer into contact with said liquid in which gas bubbles are dispersed in said vessel to obtain uniform removal of material by etching;
   providing two circuits for conveying the liquid;
   with a first circuit from a reservoir back to the reservoir, in order to enrich the liquid with a gas on the way back to the reservoir, so that the gas bubbles are formed; and
   with a second circuit between the reservoir and the vessel for conveying the liquid from the reservoir as a laminar flow to the vessel and back to the reservoir; and
   said first circuit and said second circuit being separate at all points and not overlapping with each other.

6. A process for the wet chemical treatment of a semiconductor wafer in a vessel, comprising the steps of
   dispersing gas bubbles in a liquid;
   bringing the semiconductor wafer into contact with said liquid in which gas bubbles are dispersed in said vessel to obtain uniform removal of material by etching;
   providing two circuits for conveying the liquid,
   with a first circuit having a feed pump from a reservoir back to the reservoir, in order to enrich the liquid with a gas on the way back to the reservoir, so that the gas bubbles are formed; and
   with a second circuit having a second pump between the reservoir and the vessel for conveying the liquid from the reservoir to the vessel and back to the reservoir; and
   said first circuit and said second circuit being separate at all points and not overlapping with each other.

7. The process as claimed in claim 6, comprising
in the second circuit conveying the liquid from the reservoir as a laminar flow to the vessel.

8. A process for the wet chemical treatment of a semiconductor wafer in a vessel, comprising the steps of
dispersing gas bubbles in a liquid;
bringing the semiconductor wafer into contact with said liquid in which gas bubbles are dispersed in said vessel to obtain uniform removal of material by etching;
providing two circuits for conveying the liquid;
with a first circuit from a reservoir back to the reservoir, in order to enrich the liquid with a gas on the way back to the reservoir, so that the gas bubbles are formed; and
with a second circuit from the reservoir to the vessel and back to the reservoir for conveying the liquid between the reservoir and the vessel; and
said first circuit and said second circuit overlapping with each other with the reservoir, only.

9. A process for the wet chemical treatment of a semiconductor wafer in a vessel, comprising the steps of
dispersing gas bubbles in a liquid;
bringing the semiconductor wafer into contact with said liquid in which gas bubbles are dispersed in said vessel too obtain uniform removal of material etching;
providing two circuits for conveying the liquid;
with a first circuit from a reservoir back to the reservoir, in order to enrich the liquid with a gas on the way back to the reservoir, so that the gas bubbles are formed; and
p1 with a second circuit from the reservoir to the vessel and back to the reservoir for conveying the liquid as laminar flow between the reservoir and the vessel; and
said first circuit and said second circuit overlapping with each other with the reservoir, only.

10. A process for the wet chemical treatment of a semiconductor wafer in a vessel, comprising the steps of
dispersing gas bubbles in a liquid;
bringing the semiconductor wafer into contact with said liquid in which gas bubbles are dispersed in said vessel to obtain uniform removal of material by etching;
providing two circuits for conveying the liquid;
with a first circuit having a feed pump from a reservoir back to the reservoir, in order to enrich the liquid with a gas on the way back to the reservoir, so that the gas bubbles are formed; and
with a second circuit having a second pump from the reservoir to the vessel and back to the reservoir for conveying the liquid between the reservoir and the vessel; and
said first circuit and said second circuit overlapping with each other with the reservoir, only.

11. The process as claimed in claim 10, comprising
in the second circuit conveying the liquid from the reservoir as a laminar flow to the vessel.

12. A process for the wet chemical treatment of a semiconductor wafer in a vessel, comprising the steps of
dispersing gas bubbles in a liquid;
bringing the semiconductor wafer into contact with said liquid in which gas bubbles are dispersed in said vessel to obtain uniform removal of material by etching;
providing two circuits for conveying the liquid;
with a first circuit from a reservoir back to the reservoir, in order to enrich the liquid with a gas on the way back to the reservoir, so that the gas bubbles are formed; and
with a second circuit between the reservoir and the vessel for conveying the liquid from the reservoir as a single line divided into two partial streams to the vessel and back to the reservoir as two substreams joined as a recombined stream; and
said first circuit and said second circuit being separate at all points and not overlapping with each other.

13. A process for the wet chemical treatment of a semiconductor wafer in a vessel, comprising the steps of
dispersing gas bubbles in a liquid;
bringing the semiconductor wafer into contact with said in which gas bubbles are dispersed in said vessel to obtain uniform removal of material by etching;
providing two circuits for conveying the liquid;
with a first circuit from a reservoir back to the reservoir, in order to enrich the liquid with a gas on the way back to the reservoir, so that the gas bubbles are formed; and
with a second circuit from the reservoir as a single line divided into two partial streams to the vessel and back to the reservoir as two substreams joined as a recombined stream for conveying the liquid between reservoir and the vessel; and
said first circuit and said second circuit overlapping with each other with the reservoir, only.

* * * * *